United States Patent
He et al.

(10) Patent No.: US 12,113,038 B2
(45) Date of Patent: Oct. 8, 2024

(54) THERMAL COMPRESSION FLIP CHIP BUMP FOR HIGH PERFORMANCE AND FINE PITCH

(71) Applicant: QUALCOMM Incorporated, San Diego, CA (US)

(72) Inventors: Dongming He, San Diego, CA (US); Hung-Yuan Hsu, Taichung (TW); Yangyang Sun, San Diego, CA (US); Wei Hu, San Diego, CA (US); Wei Wang, San Diego, CA (US); Lily Zhao, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 23 days.

(21) Appl. No.: 17/027,316

(22) Filed: Sep. 21, 2020

(65) Prior Publication Data
US 2021/0210449 A1    Jul. 8, 2021

Related U.S. Application Data

(60) Provisional application No. 62/956,991, filed on Jan. 3, 2020.

(51) Int. Cl.
*H01L 23/00* (2006.01)

(52) U.S. Cl.
CPC ............ *H01L 24/13* (2013.01); *H01L 24/03* (2013.01); *H01L 24/05* (2013.01); *H01L 24/11* (2013.01);
(Continued)

(58) Field of Classification Search
CPC ......... H01L 24/02; H01L 24/03; H01L 24/05; H01L 24/11; H01L 24/13;
(Continued)

(56) References Cited

U.S. PATENT DOCUMENTS 8,575,493 B1 *  11/2013  Xu ........................ H01L 24/05
174/255
9,018,758 B2 *  4/2015  Hwang ............. H01L 21/76883
257/737

(Continued)

FOREIGN PATENT DOCUMENTS

WO    2018208524 A1    11/2018

OTHER PUBLICATIONS

International Search Report and Written Opinion—PCT/US2020/058476—ISA/EPO—Feb. 10, 2021.

*Primary Examiner* — Khiem D Nguyen
(74) *Attorney, Agent, or Firm* — QUALCOMM Incorporated

(57) ABSTRACT

A thermal compression flip chip (TCFC) bump may be used for high performance products that benefit from a fine pitch. In one example, a new TCFC bump structure adds a metal pad underneath the TCFC copper pillar bump to cover the exposed aluminum bump pad. This new structure prevents the pad from corroding and reduces mechanical stress to the pad and underlying silicon dielectric layers enabling better quality and reliability and further bump size reduction. For example, a flip chip connection may include a substrate; a metal pad on a contact side of the substrate and a first passivation layer on the contact side of the substrate to protect the metal pad from corrosion.

26 Claims, 9 Drawing Sheets

(52) U.S. Cl.
CPC  *H01L 2224/13027* (2013.01); *H01L 2924/35* (2013.01)

(58) Field of Classification Search
CPC ... H01L 2224/13027; H01L 2224/0401; H01L 2224/05008; H01L 2224/05548; H01L 2224/05571; H01L 2224/05572; H01L 2224/05666; H01L 2224/13021; H01L 2224/13022; H01L 2224/13023; H01L 2224/13024; H01L 2224/05022; H01L 2224/05124; H01L 2224/114; H01L 2224/13007; H01L 2224/13082; H01L 2224/131; H01L 23/3192; H01L 2224/02126; H01L 2224/02166; H01L 2924/00014; H01L 2224/13147
USPC ......................................................... 257/737
See application file for complete search history.

(56) References Cited

U.S. PATENT DOCUMENTS

| | | | | |
|---|---|---|---|---|
| 9,406,632 | B2* | 8/2016 | Wang | H01L 24/13 |
| 9,627,339 | B2* | 4/2017 | Chang | H01L 24/11 |
| 2001/0026954 | A1* | 10/2001 | Takao | H01L 24/11 |
| | | | | 257/784 |
| 2006/0019480 | A1* | 1/2006 | Cheng | H01L 24/02 |
| | | | | 257/E23.146 |
| 2008/0001290 | A1* | 1/2008 | Chou | H01L 23/53252 |
| | | | | 257/E23.079 |
| 2009/0258486 | A1* | 10/2009 | Watanabe | H01L 24/02 |
| | | | | 257/E21.508 |
| 2010/0007011 | A1* | 1/2010 | Hung | H01L 24/48 |
| | | | | 257/784 |
| 2011/0062580 | A1* | 3/2011 | Liu | H01L 24/05 |
| | | | | 257/737 |
| 2011/0089562 | A1* | 4/2011 | Watanabe | H01L 24/02 |
| | | | | 257/737 |
| 2011/0198748 | A1* | 8/2011 | Koike | H01L 23/53238 |
| | | | | 257/E21.531 |
| 2012/0273945 | A1* | 11/2012 | Chang | H01L 24/11 |
| | | | | 257/737 |
| 2013/0026622 | A1* | 1/2013 | Chuang | H01L 24/05 |
| | | | | 257/737 |
| 2013/0147031 | A1* | 6/2013 | Chen | H01L 24/11 |
| | | | | 257/737 |
| 2014/0117533 | A1* | 5/2014 | Lei | H01L 24/05 |
| | | | | 257/E21.59 |
| 2014/0339712 | A1* | 11/2014 | Alvarado | H01L 23/3114 |
| | | | | 257/786 |
| 2014/0363966 | A1* | 12/2014 | Lin | H01L 24/11 |
| | | | | 438/614 |
| 2015/0214127 | A1* | 7/2015 | Gu | H01L 23/367 |
| | | | | 257/712 |
| 2015/0228707 | A1* | 8/2015 | Song | H01L 24/05 |
| | | | | 438/121 |
| 2015/0262952 | A1* | 9/2015 | Lee | H01L 24/13 |
| | | | | 257/737 |
| 2015/0303160 | A1* | 10/2015 | Tu | H01L 24/03 |
| | | | | 257/737 |
| 2016/0027747 | A1* | 1/2016 | Ryu | H01L 24/05 |
| | | | | 257/737 |
| 2018/0337155 | A1* | 11/2018 | Lei | H01L 24/03 |
| 2019/0043817 | A1* | 2/2019 | Kadade | H01L 24/19 |
| 2019/0378807 | A1* | 12/2019 | Kwon | H01L 24/81 |
| 2020/0251432 | A1* | 8/2020 | Lin | H01L 24/11 |
| 2020/0312732 | A1* | 10/2020 | Chi | H01L 23/3135 |

* cited by examiner

THERMAL COMPRESSION FLIP CHIP BUMP FOR HIGH PERFORMANCE AND FINE PITCH

CROSS-REFERENCE TO RELATED APPLICATIONS

The present application for patent claims the benefit of U.S. Provisional Application No. 62/956,991, entitled "THERMAL COMPRESSION FLIP CHIP BUMP," filed Jan. 3, 2020, assigned to the assignee hereof, and expressly incorporated herein by reference in its entirety.

FIELD OF DISCLOSURE

This disclosure relates generally to flip chips, and more specifically, but not exclusively, to external connections for a flip chip.

BACKGROUND

Flip chip, also known as controlled collapse chip connection or its abbreviation, C4, is a method for interconnecting semiconductor devices, such as integrated circuit (IC) chips and microelectromechanical systems (MEMS), to external circuitry with solder bumps that have been deposited onto the chip pads. The solder bumps are deposited on the chip pads on the top side of the wafer during the final wafer processing step. In order to mount the chip to external circuitry (such as a circuit board or another chip or wafer), it is flipped over so that its top side faces down, and aligned so that its pads align with matching pads on the external circuit, and then the solder is reflowed to complete the interconnect. This is in contrast to wire bonding, in which the chip is mounted upright and wires are used to interconnect the chip pads to external circuitry.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

In one aspect, a flip chip connection includes: a substrate; a metal pad on a contact side of the substrate; a first passivation layer on a contact side of the substrate, wherein the first passivation layer at least partially overlaps the metal pad; a first metal layer on a contact side of the metal pad; a metallization structure on a contact side of the first metal layer; and a contact structure on a contact side of the metallization structure.

In another aspect, a flip chip connection includes: a substrate; a metal pad on a contact side of the substrate; first passivation means for protecting on a contact side of the substrate, wherein the first passivation means at least partially overlaps the metal pad; a first metal layer on a contact side of the metal pad; a metallization structure on a contact side of the first metal layer; and a contact structure on a contact side of the metallization structure.

In still another aspect, a method for manufacturing a flip chip connection includes: providing a substrate; forming a metal pad on a contact side of the substrate; forming a first passivation layer on a contact side of the substrate, wherein the first passivation layer at least partially overlaps the metal pad; forming a first metal layer on a contact side of the metal pad; forming a metallization structure on a contact side of the first metal layer; and forming a contact structure on a contact side of the metallization structure.

In still another aspect, a non-transitory computer-readable medium includes instructions that when executed by a processor cause the processor to perform a method, the method including: providing a substrate; forming a metal pad on a contact side of the substrate; forming a first passivation layer on a contact side of the substrate, wherein the first passivation layer at least partially overlaps the metal pad; forming a first metal layer on a contact side of the metal pad; forming a metallization structure on a contact side of the first metal layer; and forming a contact structure on a contact side of the metallization structure.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure, and in which.

Figure 1:
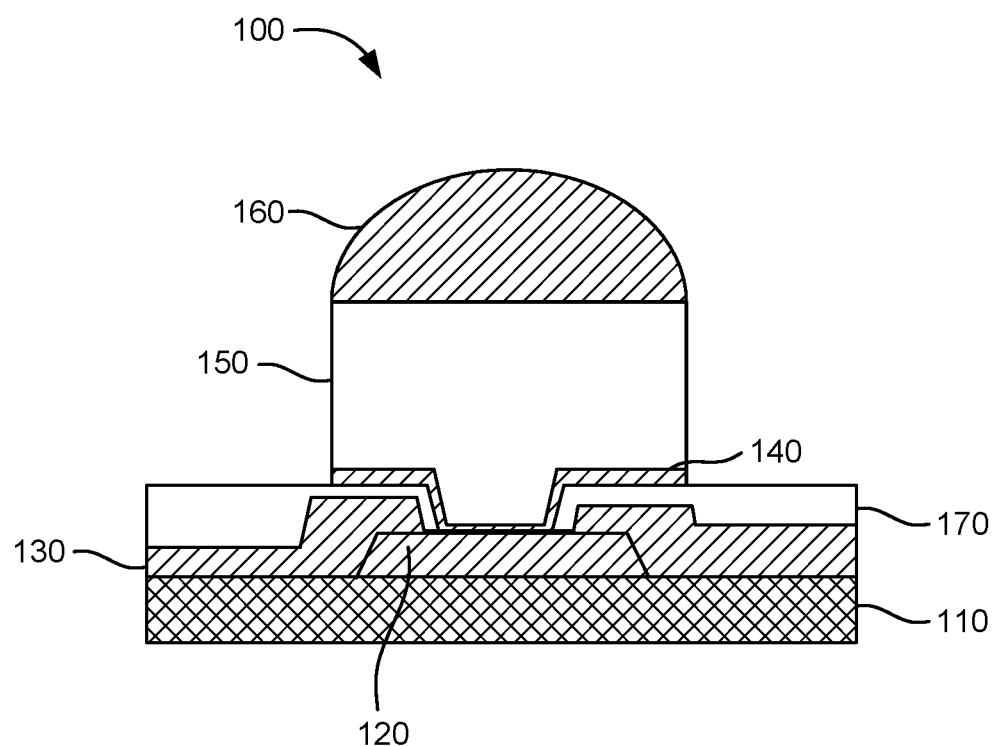
FIG. 1 illustrates a flip chip connection.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all compo-

DETAILED DESCRIPTION

Thermal Compression Flip Chip (TCFC) bonding is a new interconnection technology in electronic packaging. With decreasing pitch of die to package interconnects, traditional mass reflow solder bump or copper pillar bump faces the risk of shorting, or non-wets or cracking weak low-K dielectric layers due to mechanical stress for very fine pitch devices. The drive for ever-increasing numbers of interconnects, coupled with limited package size, forces finer pitch flip-chip solutions. Thus, a TCFC bump may be used for high performance products with a fine pitch and an exposed aluminum (Al) bump pad on chip. However, the Al bump pad is subject to corrosion. Thus, a new TCFC bump structure that protects the bump pad, prevents Al pad corrosion, and reduces mechanical stress to Al pad and underlying silicon dielectric layers to enabling better quality, reliability, and further bump size reduction is needed. The methods, apparatus, and systems disclosed herein mitigate shortcomings of the conventional methods, apparatus, and systems, as well as other previously unidentified needs.

In accordance with the various aspects disclosed herein, at least one aspect includes a flip chip connection with: a substrate; a metal pad on a contact side of the substrate; a first passivation layer on the contact side of the substrate; a first metal layer on a contact side of the metal pad; a metallization structure on a contact side of the first metal layer; and a contact structure on a contact side of the metallization structure. As used herein, a metallization structure may include metal layers, vias, pads, or traces with dielectric between, configured to redistribute signals such as a redistribution layer (RDL). Among the various technical advantages the various aspects disclosed provide, in at least some aspects, the feature of a first passivation layer provides for corrosion protection of the metal pad. This new structure prevents the pad from corroding and reduces mechanical stress to the pad and underlying silicon dielectric layers enabling better quality and reliability and further bump size reduction. Other technical advantages will be recognized from various aspects disclosed herein and these technical advantages are merely provided as examples and should not be construed to limit any of the various aspects disclosed herein.

Examples herein include TCFC bumps that may be used for high performance products that benefit from a fine pitch. In one example, a new TCFC bump structure adds a metal pad (such as copper pad that can also be used as metallization structure) underneath the TCFC copper pillar bump to cover the exposed Al bump pad. This new structure prevents the Al pad from corroding and reduces mechanical stress to Al pad and underlying silicon dielectric layers enabling better quality and reliability and further bump size reduction. In addition, an exposed Al pad is more prone to corrosion than other metals, such as Cu or Ni that may be used for the new bump structure as an added metal pad to help prevent corrosion.

FIG. 1 illustrates a flip chip connection. As shown in FIG. 1, a flip chip connection 100 may include a substrate 110 (such as silicon or glass), a metal pad 120 (such as Aluminum) on a first side on the substrate 110, a first passivation layer 130 (may be a hard passivation layer such as an oxide, metal oxide, and nitride) on a first side on the substrate 110, wherein the first passivation layer 130 at least partially overlaps the metal pad 120 (to protect or cover the metal pad); a first metal layer 140 (such as an under bump metal, such as titanium) on the metal pad 120; a second metal layer 150 (such as a conductive metal, such as a copper pillar or ball) on the first metal layer 140; and a contact structure 160 (such as a solder ball or a reflowed solder ball) on the second metal layer 150. As shown in FIG. 1, the flip chip connection 100 may also include a second passivation layer 170 (such as a polymer) on a first side of the first passivation layer 130 opposite the substrate 110. As also can be seen from FIG. 1, the metal pad 120 is completely covered and not exposed to any materials or the air and the "u" shape of the covering material also provides some mechanically stress relief with the shoulders supporting more of the force applied to the connection. As used herein, the first passivation layer 130 may be a hard passivation layer, such as an oxide, metal oxide, and nitride or combination that protects from moisture, oxidation and/or physical damage in addition to electrical insulation. The second passivation layer 170 may be a polymer layer that serves as a stress buffer and enhances adhesion with an underfill or a molding compound on the first passivation layer 130.

Figure 2:
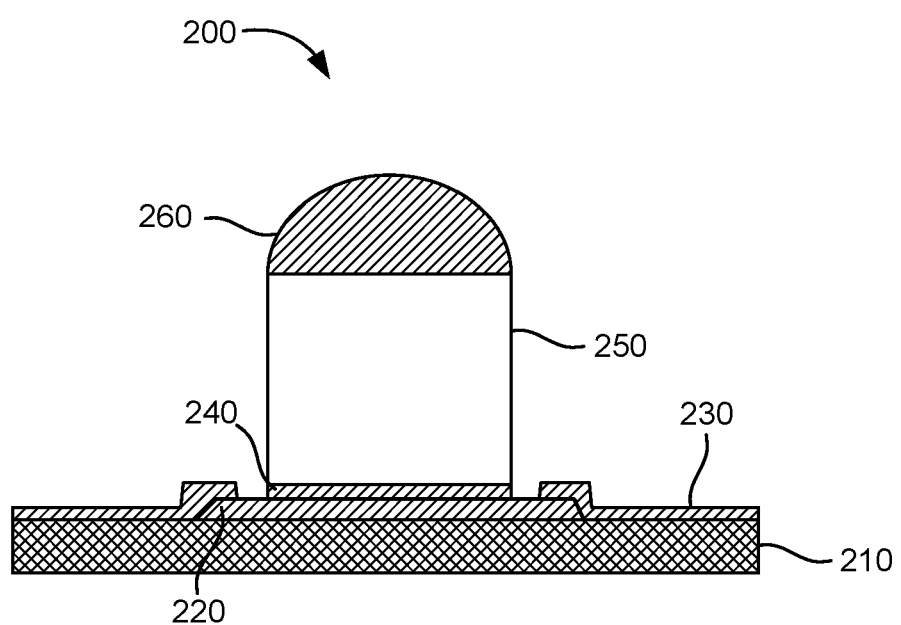
FIG. 2 illustrates a flip chip connection without a second passivation layer.

FIG. 2 illustrates a flip chip connection without a second passivation layer. As shown in FIG. 2, a flip chip connection 200 may include a substrate 210 (such as silicon or glass), a metal pad 220 (such as Aluminum) on a first side on the substrate 210, a first passivation layer 230 (such as a hard passivation layer, such as an oxide, metal oxide, and nitride) on a first side on the substrate 210, wherein the first passivation layer 230 at least partially overlaps the metal pad 220; a first metal layer 240 (such as an under bump metal, such as titanium) on the metal pad 220; a second metal layer 250 (such as a conductive metal, such as a copper pillar or ball) on the first metal layer 240; and a contact structure 260 on the second metal layer 250. As can be seen from FIG. 2, the metal pad 220 is partially exposed to any external materials including air.

Figure 3:
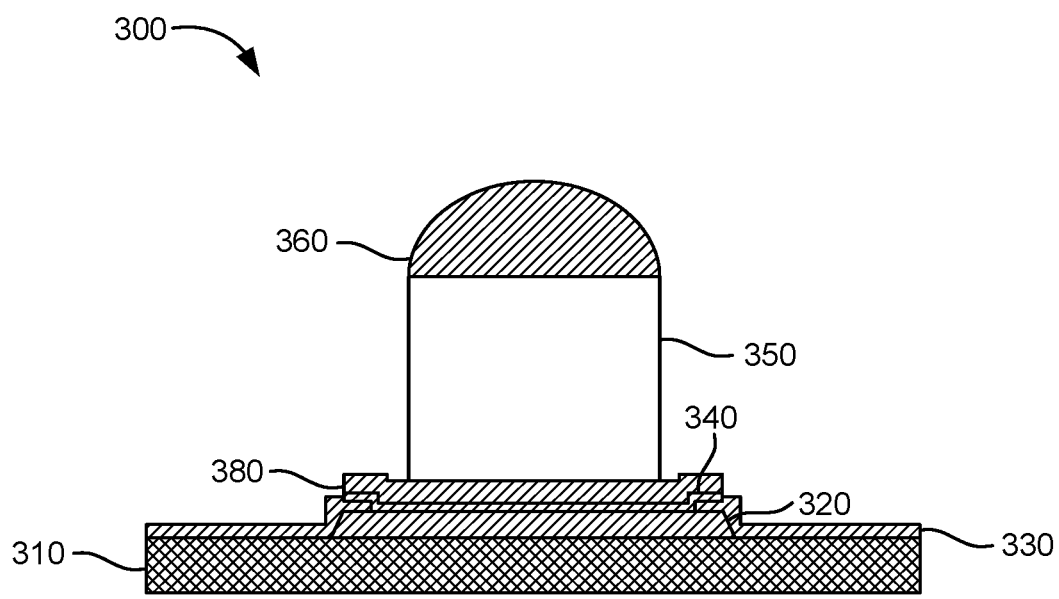
FIG. 3 illustrates a flip chip connection with a redistribution layer (metallization structure) in accordance with some examples of the disclosure.

FIG. 3 illustrates a flip chip connection with a metallization structure in accordance with some examples of the disclosure. As shown in FIG. 3, a flip chip connection 300 may include a substrate 310 (such as silicon or glass), a metal pad 320 (such as Aluminum) on the substrate 310, a first passivation layer 330 (such as a hard passivation layer including an oxide, metal oxide, or nitride) on a contact side of the substrate 310. As used herein, the term "contact side" is intended to refer to a side of the layer, structure, component, etc. that is oriented toward the connection (such as contact structure) of the flip chip connection, as opposed to the substrate side, which is intended to refer to the side oriented toward the substrate 310. The first passivation layer 330 may at least partially overlap the metal pad 320. A first metal layer 340 (such as an under bump metal, such as titanium) is disposed on a contact side of the metal pad 320. A metallization structure 380 is disposed on a contact side of the first metal layer 340. A contact structure is disposed on a contact side of the metallization structure 380. The contact structure may be formed of any suitable contact configuration (such as a conductive metal including copper pillar 350 with a solder portion 360 (such as a solder ball or a reflowed solder ball)). As shown in FIG. 3, the flip chip connection 300 may also include a metallization structure 380 disposed on a contact side the first metal layer 340. As also can be seen from FIG. 3, the metal pad 320 is completely covered and not exposed to any materials or the air and the covering material also provides some mechanically stress relief with the shoulders supporting more of the force applied to the connection. It should be understood that metallization structure 380 is not limited to application on a top of metal pad 320 only. Metallization structure 380 may be used to provide a connection to other bumps and structures with the same electrical function and improve current or signal distribution. In addition, as noted in the foregoing, the metallization structure may include metal layers, vias, pads, or traces with dielectric between, configured to redistribute signals such as a redistribution layer (RDL).

Figure 4:
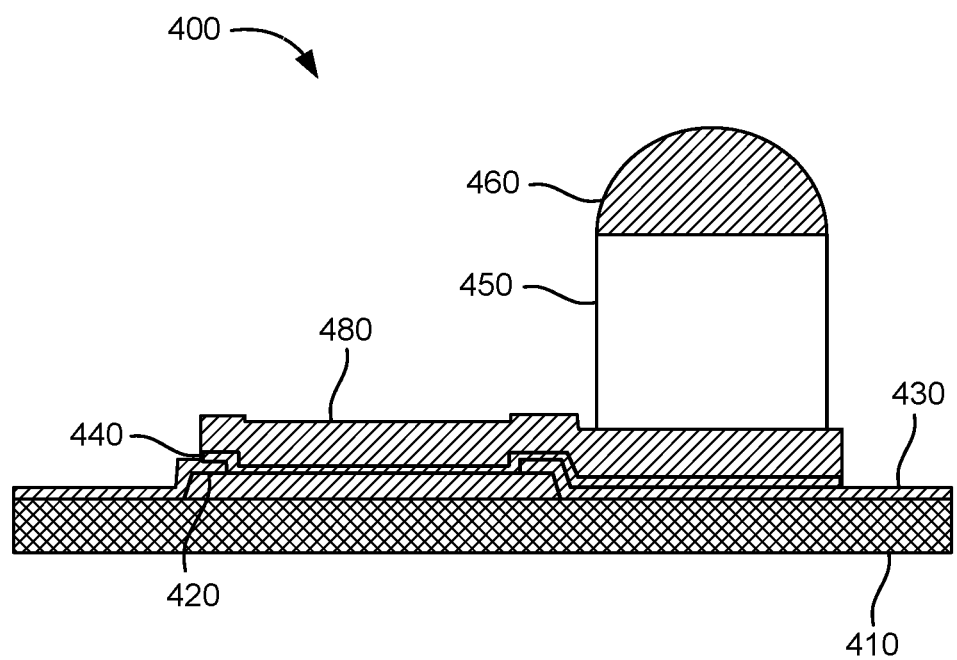
FIG. 4 illustrates a offset flip chip connection in accordance with some examples of the disclosure.

FIG. 4 illustrates an offset flip chip connection in in accordance with some examples of the disclosure. As shown in FIG. 4, a flip chip connection 400 may include a substrate 410 (such as silicon or glass); a metal pad 420 (such as Aluminum) on a contact side of the substrate 410; a first passivation layer 430 (such as a hard passivation layer including oxide, metal oxide, or nitride) on the contact side of the substrate 410, wherein the first passivation layer 430 at least partially overlaps the metal pad 420; a first metal layer 440 (such as an under bump metal including titanium and similar materials) on a contact side of the metal pad 420; a metallization structure 480 on a contact side of the first metal layer 440; and a contact structure disposed on a contact side of the metallization structure 480. The contact structure may be formed of any suitable contact configuration (such as a conductive metal including copper pillar 450 with a solder portion 460 (such as a solder ball or a reflowed solder ball). As shown in FIG. 4, the flip chip connection 400 may also include a metallization structure 480 on a first side of the first metal layer 440 opposite the metal pad 420. As can be seen from FIG. 4, the metallization structure 480 is vertically and horizontally offset from the metal pad 420. As also can be seen from FIG. 4, the metal pad 420 is completely covered and not exposed to any materials or the air and the covering material also provides some mechanically stress relief with the shoulders supporting more of the force applied to the connection. As illustrated in this example, the bump location is adjustable by increasing or decreasing the distance to neighboring bumps if desired. In addition, metal pad 420 size and the first passivation layer 430 opening size may also be reduced if bump location is offset and not stacked on top of metal pad 420 directly in the center.

Figure 5A:
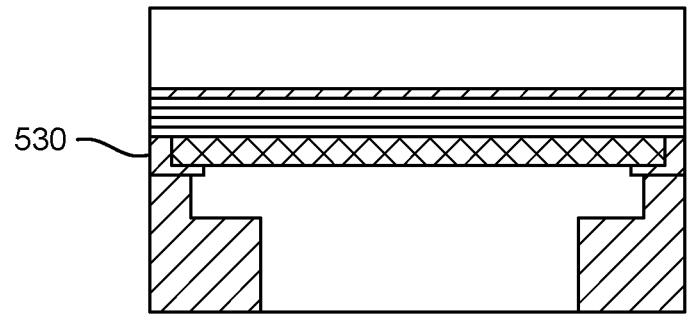
FIGS. 5A-C illustrate a side and top views of flip chip connections in accordance with some examples of the disclosure.
Figure 5B:
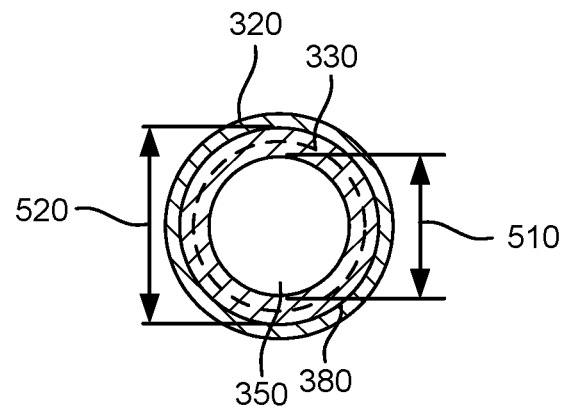
Figure 5C:
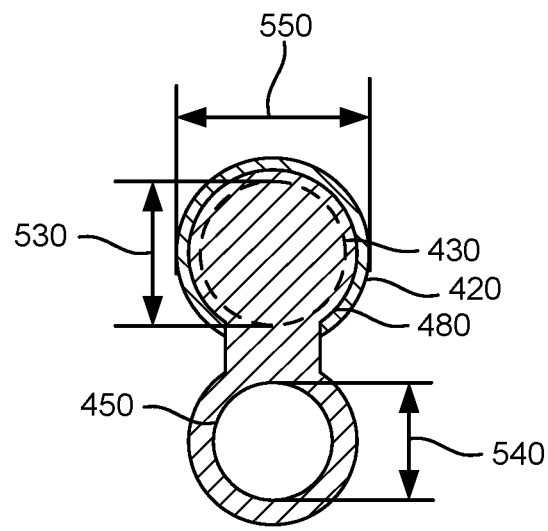

FIGS. 5A-C illustrate a side and top views of flip chip connections in accordance with some examples of the disclosure. As shown in FIG. 5A, the passivation layer(s) 430 provides a shoulder structure to provide mechanical support. FIG. 5B shows a partial top view of the connection 300. As can be seen, the copper pillar 350 has a smaller diameter 510 (such as 30-40 μM), the metal pad 320 has a larger diameter, the metallization structure 380 has a middle diameter 520 (such as 40-50 μM), the passivation layer 330 is partially open (dashed line). FIG. 5C shows a partial top view of the connection 400. In some example, the metal pad 420 diameter 550 may be smaller than the copper pillar 450 diameter 540 since the copper pillar 450 is no longer directly on top of metal pad 420 though not illustrated in FIG. 5C and the passivation layer 430 has a diameter 530 as shown.

Figure 6A:
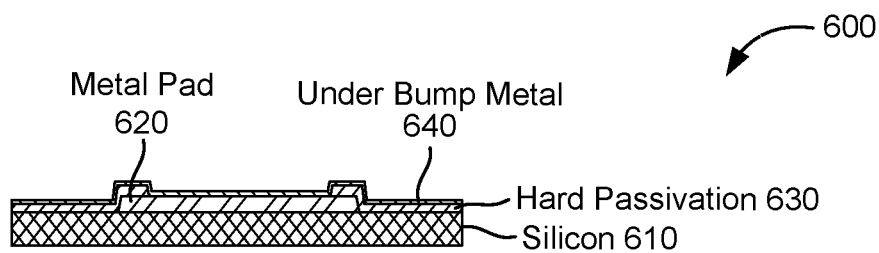
FIGS. 6A-D illustrate a method for manufacturing a flip chip connection in accordance with some examples of the disclosure.
Figure 6B:
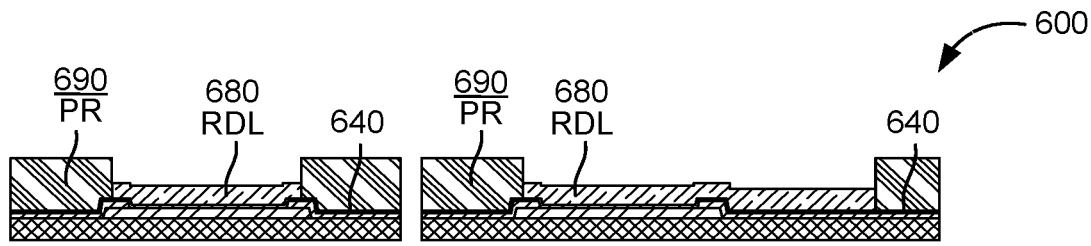
Figure 6C:
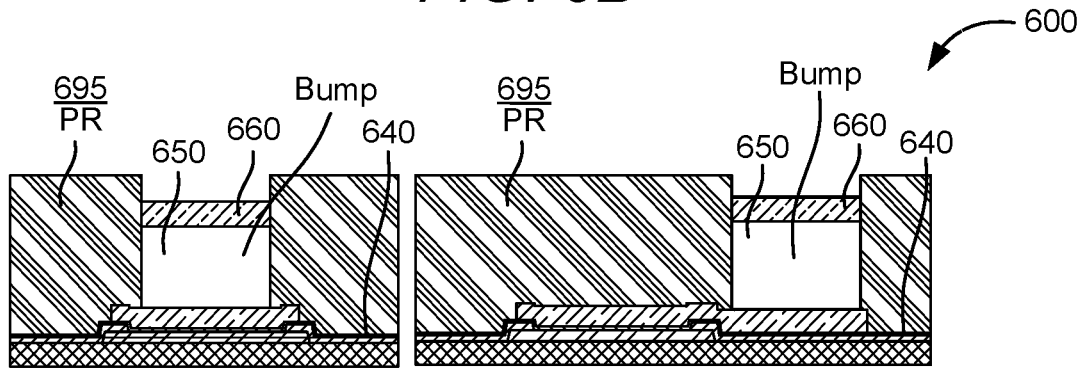
Figure 6D:
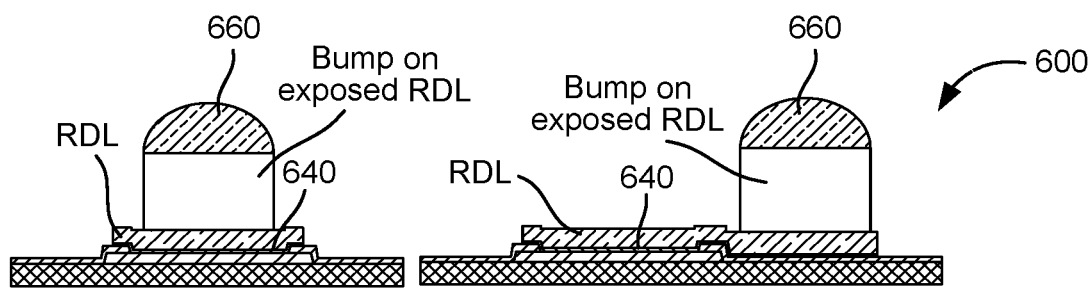

FIGS. 6A-D illustrate a method for manufacturing a flip chip connection in accordance with some examples of the disclosure. As shown in FIG. 6A, the partial method 600 begins with providing a substrate 610. The substrate may be part of a wafer or single substrate and, for example, silicon or glass. Next, a metal pad 620 is formed on a contact side of the substrate 610. Then, a first passivation layer 630 is formed on a contact side of the substrate 610 at least partially overlapping the metal pad followed by forming (such as sputtering) a first metal layer 640 on a contact side of the metal pad 620. The partial method 600 continues in FIG. 6B with applying a first photoresist 690 on the top of the current structure and then photo patterning the photoresist 690 to expose a portion of the first metal layer 640, forming a metallization structure 680 on the exposed first metal layer 640, and removing the photoresist. In addition, the partial method 600 may include forming an additional metal layer using different material, on the metallization structure 680. The partial method 600 continues in FIG. 6C with an optional second forming of the first metal layer 640, applying a second photoresist 695, forming a copper pillar 650 on a contact side of the metallization structure 680, forming a solder structure 660 on a contact side of the copper pillar 650, and removing the second photoresist 695. The partial method 600 concludes in FIG. 6D with etching the first metal layer 640 and a reflow of the solder structure 660.

Figure 7:
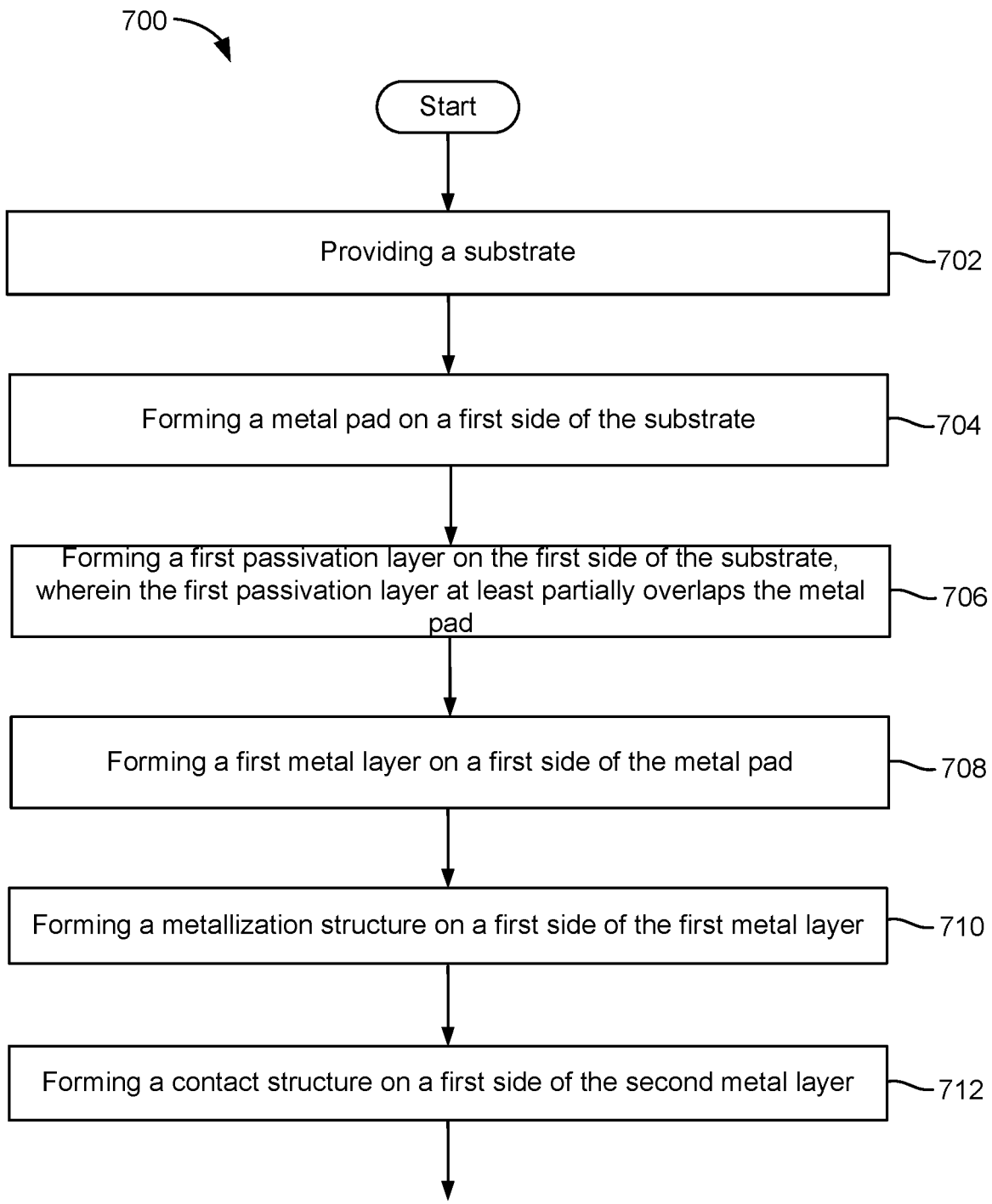
FIG. 7 illustrates another method for manufacturing a flip chip connection in accordance with some examples of the disclosure.

FIG. 7 illustrates another method for manufacturing a flip chip connection in accordance with some examples of the disclosure. As shown in FIG. 7, the partial method 700 may begin in block 702 with providing a substrate (such as silicon or glass). The partial method 700 may continue in block 704 with forming a metal pad on a contact side of the substrate. The partial method 700 may continue in block 706 with forming a first passivation layer on a contact side of the substrate, wherein the first passivation layer at least partially overlaps the metal pad. The partial method 700 may continue in block 708 with forming a first metal layer on a contact side of the metal pad. The partial method 700 may continue in block 710 with forming a metallization structure on a contact side of the first metal layer. The partial method 700 may conclude in block 712 with forming a contact structure on a contact side of the metallization structure. Alternatively, the partial method 700 may also include forming a second passivation layer on a contact side of the first passivation layer and/or extending the metallization structure (such as a metallization structure that may include metal layers, vias, pads, or traces with dielectric between that function to redistribute signals) away from the contact structure.

Figure 8:
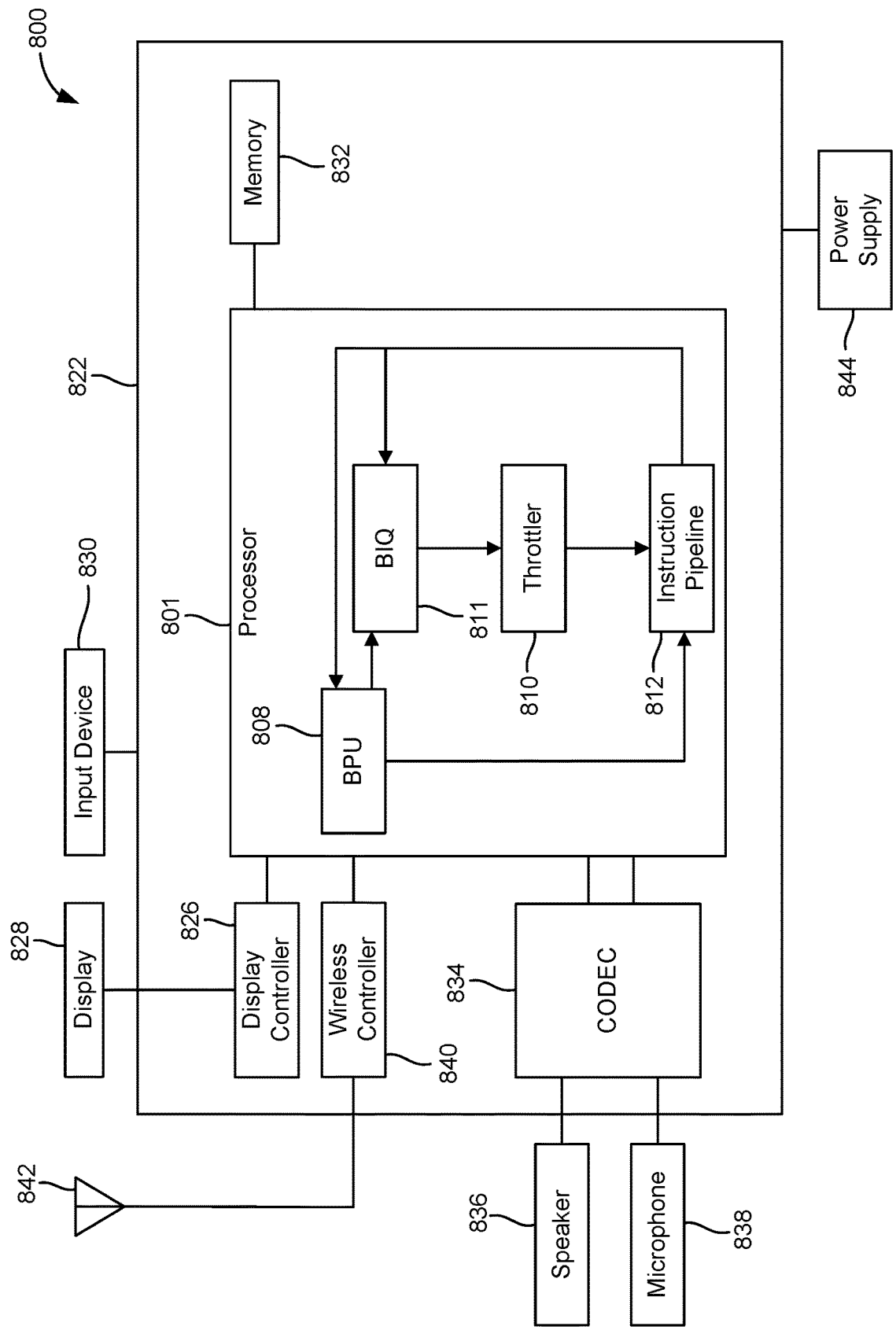
FIG. 8 illustrates a mobile device in accordance with some examples of the disclosure.

FIG. 8 illustrates a mobile device in accordance with some examples of the disclosure. Referring now to FIG. 8, a block diagram of a mobile device 800 that is configured according to aspects is depicted. In some aspects, mobile device 800 may be configured as a wireless communication device. As shown, mobile device 800 includes processor 801, which may be configured to implement the methods described herein in some aspects. Processor 801 is shown to include instruction pipeline 812, buffer processing unit (BPU) 808, branch instruction queue (BIQ) 811, and throttler 810 as is well known in the art. Other well-known details (such as counters, entries, confidence fields, weighted sum, comparator, etc.) of these blocks have been omitted from this view of processor 801 for the sake of clarity.

Processor 801 may be communicatively coupled to memory 832 over a link, which may be a die-to-die or chip-to-chip link. Mobile device 800 also include display 828 and display controller 826, with display controller 826 coupled to processor 801 and to display 828.

In some aspects, FIG. 8 may include coder/decoder (CODEC) 834 (such as an audio and/or voice CODEC) coupled to processor 801; speaker 836 and microphone 838 coupled to CODEC 834; and wireless controller 840 (which may include a modem) coupled to wireless antenna 842 and to processor 801.

In a particular aspect, where one or more of the above-mentioned blocks are present, processor 801, display controller 826, memory 832, CODEC 834, and wireless controller 840 can be included in a system-in-package or system-on-chip device 822. Input device 830 (such as physical or virtual keyboard), power supply 844 (such as battery), display 828, input device 830, speaker 836, microphone 838, wireless antenna 842, and power supply 844 may be external to system-on-chip device 822 and may be coupled to a component of system-on-chip device 822, such as an interface or a controller.

It should be noted that although FIG. 8 depicts a mobile device, processor 801 and memory 832 may also be integrated into a set top box, a music player, a video player, an entertainment unit, a navigation device, a personal digital assistant (PDA), a fixed location data unit, a computer, a laptop, a tablet, a communications device, a mobile phone, or other similar devices.

Figure 9:
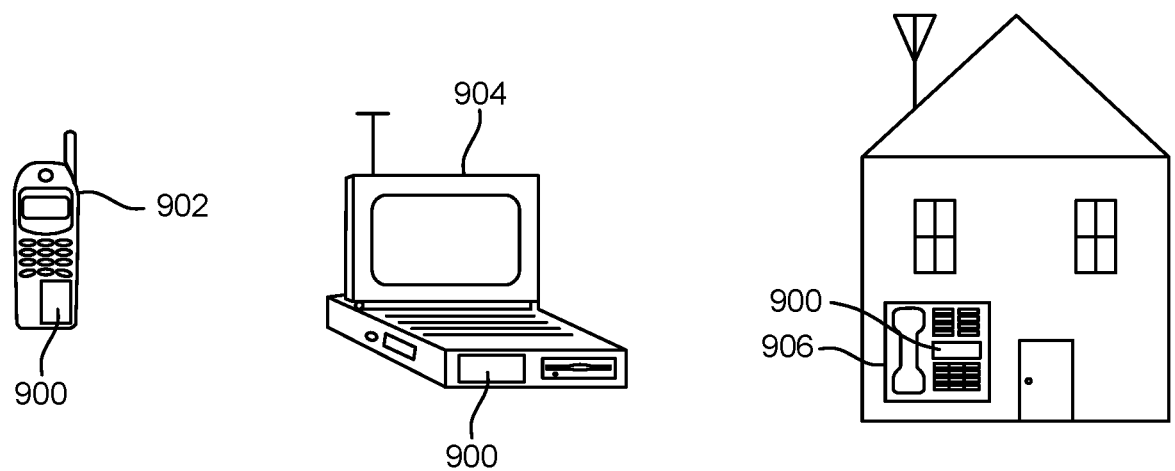
FIG. 9 illustrates various electronic devices in accordance with some examples of the disclosure.

FIG. 9 illustrates various electronic devices that may be integrated with any of the aforementioned integrated device, semiconductor device, integrated circuit, die, interposer, package or package-on-package (PoP) in accordance with some examples of the disclosure. For example, a mobile phone device 902, a laptop computer device 904, and a fixed location terminal device 906 may include an integrated device 900 as described herein. The integrated device 900 may be, for example, any of the integrated circuits, dies, integrated devices, integrated device packages, integrated circuit devices, device packages, integrated circuit (IC) packages, package-on-package devices described herein. Other electronic devices may also feature the integrated device 900 including, but not limited to, a group of devices (such as electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (such as autonomous vehicles), or any other device that stores or retrieves data or computer instructions, or any combination thereof.

It will be appreciated that various aspects disclosed herein can be described as functional equivalents to the structures, materials and/or devices described and/or recognized by those skilled in the art. It should furthermore be noted that methods, systems, and apparatus disclosed in the description or in the claims can be implemented by a device including means for performing the respective actions of this method. For example, in one aspect, a flip chip connection may include: a substrate (such as silicon or glass); a metal pad on a contact side of the substrate; first passivation means (such as first passivation layer) for protecting on a contact side of the substrate; a first metal layer on a contact side of the metal pad; a metallization structure on a contact side of the first metal layer; and a contact structure on a contact side of the metallization structure. In addition, the connection may also include one or more of second passivation means (such as second passivation layer) on a contact side of the first passivation means or extending the metallization structure. It should be understood that passivation materials may be a dielectric. For example, the first passivation means may be a CVD film stack made of SiOx and SiNx or SiON that is also a moisture barrier. Water molecules can diffuse through SiOx but cannot diffuse through SiNx or SiON. (such as intermetal CVD dielectric layers for silicon build up layers may be a SiOx based film that is not hermetic). The second passivation mean (i.e., re-passivation means) may be a spin coat polymer that is non-hermetic and can absorb moisture that creates a good stress buffer layer and provides better adhesion to underfill or molding compounds. For example, the first passivation means may be a hard passivation layer, such as an oxide, metal oxide, nitride, or a combination, that protects from moisture, oxidation and/or physical damage in addition to electrical insulation. The second passivation means may be a polymer layer that serves as a stress buffer and enhances adhesion with an underfill or a molding compound.

It will be appreciated that the aforementioned aspects are merely provided as examples and the various aspects claimed are not limited to the specific references and/or illustrations cited as examples.

One or more of the components, processes, features, and/or functions illustrated in FIGS. 1-9 may be rearranged and/or combined into a single component, process, feature or function or incorporated in several components, processes, or functions. Additional elements, components, processes, and/or functions may also be added without departing from the disclosure. It should also be noted that FIGS. 1-9 and its corresponding description in the present disclosure is not limited to dies and/or ICs. In some implementations, FIGS. 1-9 and its corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (PoP) device, and/or an interposer. An active side of a device, such as a die, is the part of the device that contains the active components of the device (such as transistors, resistors, capacitors, inductors etc.), which perform the operation or function of the device. The backside of a device is the side of the device opposite the active side.

As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms include, but are not limited to, a music player, a video player, an entertainment unit, a navigation device, a communications device, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (such as wireless, cellular, infrared, short-range radio, etc.). These terms are also intended to include devices which communicate with another device that can receive wireless communication and/or navigation signals such as by short-range wireless, infrared, wireline connection, or other connection, regardless of whether satellite signal reception, assistance data reception, and/or position-related processing occurs at the device or at the other device. In addition, these terms are intended to include all devices, including wireless and wireline communication devices, that are able to communicate with a core network via a radio access network (RAN), and through the core network the UEs can be connected with external networks such as the Internet and with other UEs. Of course, other mechanisms of connecting to the core network and/or the Internet are also possible for the UEs, such as over a wired access network, a wireless local area network (WLAN) (such as based on IEEE 802.11, etc.) and so on. UEs can be embodied by any of a number of types of devices including but not limited to printed circuit (PC) cards, compact flash devices, external or internal modems, wireless or wireline phones, smartphones, tablets, tracking devices, asset tags, and so on. A communication link through which UEs can send signals to a RAN is called an uplink channel (such as a reverse traffic channel, a reverse control channel, an access channel, etc.).

The terminology used herein is for the purpose of describing particular examples and is not intended to be limiting of examples of the disclosure. As used herein, the singular forms "a," "an," and "the" are intended to include the plural forms as well, unless the context clearly indicates otherwise. It will be further understood that the terms "includes," and/or "including," when used herein, specify the presence of stated features, integers, actions, operations, elements, and/or components, but do not preclude the presence or addition of one or more other features, integers, actions, operations, elements, components, and/or groups thereof.

It should be noted that the terms "connected," "coupled," or any variant thereof, mean any connection or coupling, either direct or indirect, between elements, and can encompass a presence of an intermediate element between two elements that are "connected" or "coupled" together via the intermediate element.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can include one or more elements.

Nothing stated or illustrated depicted in this application is intended to dedicate any component, action, feature, benefit, advantage, or equivalent to the public, regardless of whether the component, action, feature, benefit, advantage, or the equivalent is recited in the claims.

Although some aspects have been described in connection with a device, it goes without saying that these aspects also constitute a description of the corresponding method, and so a block or a component of a device should also be understood as a corresponding method action or as a feature of a method action. Analogously thereto, aspects described in connection with or as a method action also constitute a description of a corresponding block or detail or feature of a corresponding device. Some or all of the method actions can be performed by a hardware apparatus (or using a hardware apparatus), such as, for example, a microprocessor, a programmable computer or an electronic circuit. In some examples, some or a plurality of the most important method actions can be performed by such an apparatus.

In the detailed description above it can be seen that different features are grouped together in examples. This manner of disclosure should not be understood as an intention that the claimed examples have more features than are explicitly mentioned in the respective claim. Rather, the disclosure may include fewer than all features of an individual example disclosed. Therefore, the following claims should hereby be deemed to be incorporated in the description, each claim by itself can stand as a separate example. Although each claim by itself can stand as a separate example, it should be noted that—although a dependent claim can refer in the claims to a specific combination with one or a plurality of claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

Furthermore, in some examples, an individual action can be subdivided into a plurality of sub-actions or contain a plurality of sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. A flip chip connection comprising:
    a substrate formed from silicon (Si);
    a metal pad in direct contact with a contact side of the substrate;
    a first passivation layer in direct contact with the contact side of the substrate, wherein the first passivation layer at least partially overlaps the metal pad;
    a first metal layer on a contact side of the metal pad;
    a metallization structure on a contact side of the first metal layer, the metallization structure comprising a redistribution layer (RDL); and
    a contact structure on a contact side of the metallization structure, the contact structure comprising a copper pillar and a solder portion,
    wherein widths of the copper pillar and the solder portion are equal.

2. The flip chip connection of claim 1, wherein the first passivation layer is a hard passivation layer.

3. The flip chip connection of claim 2, wherein the first passivation layer comprises one of an oxide, nitride, or metal oxide.

4. The flip chip connection of claim 1, further comprising a second passivation layer on a contact side of the first passivation layer.

5. The flip chip connection of claim 4, wherein the second passivation layer comprises a polymer.

6. The flip chip connection of claim 1, wherein the metallization structure is configured to redistribute signals.

7. The flip chip connection of claim 6, wherein the metallization structure is vertically and horizontally offset from the metal pad.

8. The flip chip connection of claim 1, wherein the flip chip connection is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

9. A flip chip connection comprising:
a substrate formed from silicon (Si);
a metal pad in direct contact with a contact side of the substrate;
first passivation means in direct contact with the contact side of the substrate, wherein the first passivation means at least partially overlaps the metal pad;
a first metal layer on a contact side of the metal pad;
a metallization structure on a contact side of first metal layer, the metallization structure comprising a redistribution layer (RDL); and
a contact structure on a contact side of the metallization structure, the contact structure comprising a copper pillar and a solder portion,
wherein widths of the copper pillar and the solder portion are equal.

10. The flip chip connection of claim 9, wherein the first passivation means is a hard passivation layer.

11. The flip chip connection of claim 10, wherein the first passivation means comprises one of an oxide, nitride, or metal oxide.

12. The flip chip connection of claim 9, further comprising second passivation means on a contact side of the first passivation means.

13. The flip chip connection of claim 12, wherein the second passivation means comprises a polymer.

14. The flip chip connection of claim 9, wherein the metallization structure is configured to redistribute signals.

15. The flip chip connection of claim 14, wherein the metallization structure is vertically and horizontally offset from the metal pad.

16. The flip chip connection of claim 9, wherein the flip chip connection is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

17. A method for manufacturing a flip chip connection, the method comprising:
providing a substrate formed from silicon (Si);
forming a metal pad in direct contact with a contact side of the substrate;
forming a first passivation layer in direct contact with the contact side of the substrate, wherein the first passivation layer at least partially overlaps the metal pad;
forming a first metal layer on a contact side of the metal pad;
forming a metallization structure on a contact side of the first metal layer, the metallization structure comprising a redistribution layer (RDL); and
forming a contact structure on a contact side of the metallization structure, the contact structure comprising a copper pillar and a solder portion,
wherein widths of the copper pillar and the solder portion are equal.

18. The method of claim 17, wherein the first passivation layer comprises one of an oxide, nitride, or metal oxide.

19. The method of claim 17, wherein the method further comprises forming a second passivation layer on a contact side of the first passivation layer.

20. The method of claim 17, wherein the metallization structure is configured to redistribute signals.

21. The method of claim 20, wherein the metallization structure is vertically and horizontally offset from the metal pad.

22. A non-transitory computer-readable medium comprising instructions that when executed by a processor cause the processor to perform a method, the method comprising:
providing a substrate formed from silicon (Si);
forming a metal pad in direct contact with a contact side of the substrate;
forming a first passivation layer in direct contact with the contact side of the substrate, wherein the first passivation layer at least partially overlaps the metal pad;
forming a first metal layer on a contact side of the metal pad;
forming a metallization structure on a contact side of the first metal layer, the metallization structure comprising a redistribution layer (RDL); and
forming a contact structure on a contact side of the metallization structure, the contact structure comprising a copper pillar and a solder portion,
wherein widths of the copper pillar and the solder portion are equal.

23. The non-transitory computer-readable medium of claim 22, wherein the first passivation layer comprises one of an oxide, nitride, or metal oxide.

24. The non-transitory computer-readable medium of claim 22, wherein the method further comprises forming a second passivation layer on a contact side of the first passivation layer.

25. The non-transitory computer-readable medium of claim 22, wherein the metallization structure is configured to redistribute signals.

26. The non-transitory computer-readable medium of claim 25, wherein the metallization structure is vertically and horizontally offset from the metal pad.

* * * * *